United States Patent [19]

Parent

[11] Patent Number: 5,173,283

[45] Date of Patent: *Dec. 22, 1992

[54] PLATELETS FOR PRODUCING SILICON CARBIDE PLATELETS AND THE PLATELETS SO-PRODUCED

[75] Inventor: Luc Parent, Chicoutimi, Canada

[73] Assignee: Alcan International Limited, Montreal, Canada

[ * ] Notice: The portion of the term of this patent subsequent to Jan. 14, 2009 has been disclaimed.

[21] Appl. No.: 830,988

[22] Filed: Feb. 4, 1992

Related U.S. Application Data

[63] Continuation of Ser. No. 591,431, Oct. 1, 1990, abandoned.

[51] Int. Cl.$^5$ .................. C01B 31/36; C30B 23/00
[52] U.S. Cl. .................. 423/345; 156/603; 156/DIG. 64; 501/88
[58] Field of Search .............. 423/344, 345; 501/88; 156/603, DIG. 64

[56] References Cited

U.S. PATENT DOCUMENTS

| | | | |
|---|---|---|---|
| 3,025,192 | 3/1962 | Lowe | 148/33 |
| 3,271,109 | 9/1966 | Mezey et al. | 23/208 |
| 4,126,652 | 11/1978 | Oohara et al. | 264/29.6 |
| 4,226,841 | 10/1980 | Komeya et al. | 423/345 |
| 4,536,379 | 8/1985 | Carlson et al. | 423/345 |
| 4,659,022 | 4/1987 | Seider et al. | 241/23 |
| 4,702,900 | 10/1987 | Kurachi et al. | 423/345 |
| 4,756,895 | 7/1988 | Boecker et al. | 423/345 |
| 4,906,324 | 3/1990 | Weaver et al. | 156/610 |
| 4,981,665 | 1/1991 | Boecker et al. | 423/345 |

FOREIGN PATENT DOCUMENTS

| | | | |
|---|---|---|---|
| 0371770 | 6/1990 | European Pat. Off. | 423/345 |
| 2272032 | of 0000 | France . | |
| 57-071869 | of 0000 | Japan . | |
| 60-081064 | of 0000 | Japan . | |
| 58-204812 | of 0000 | Japan . | |
| 79168288 | 7/1981 | Japan | 423/345 |

OTHER PUBLICATIONS

Bootsma et al., "Phase Transformations...", Journal of Crystal Growth, 8 (1971), pp. 341-353.
Kistler et al., "Phase Transformations...", Int. J. High Tech. Ceramics, 2 (1986) [8/14/8], pp. 99-113.
Hamilton, "Preparation of Crystals...", Journal of the Electrochemical Society, vol. 105, No. 12, pp. 735-738.
S. C. Weaver, R. O. Nixdorf & G. Vaughan, "SiC Whiskers and Platelets", Ceramic Transactions—Silicon Carbide, 87, vol. 2, published by The American Ceramic Society Inc., USA.

Primary Examiner—Olik Chaudhuri
Assistant Examiner—Ken Horton
Attorney, Agent, or Firm—Cooper & Dunham

[57] ABSTRACT

A process for producing silicon carbide platelets having a size of 20 μm or less, and the platelets so produced. The process comprises reacting particles of a non-graphitizable form of hard carbon containing 0.5-1.5% by weight of aluminum and at least 0.2% by weight of iron (preferably anthracite coal, most preferably Pennsylvania anthracite), with silica or a silica precursor at a temperature in the range of 1800°-2100° C. under an inert atmosphere. If the carbon contains 0.2-1.0% by weight of iron, 0.1-10% by weight of boron, relative to the weight of $SiO_2$, is added (if not already present). In the invention, 0.1-10% by weight of the reaction mixture of alpha silicon carbide particles having a size of 5 μm or less are added to the reaction mixture to control the size of the platelets so that a majority have a size of less than 20 μm. The carbon is in the form of particles of less than 50 μm and the silica or precursor is preferably in the form of particles of less than about 1 μm. The weight ratio of silica to carbon is greater than 1.67:1. The resulting small SiC platelets are substantially unagglomerated, have a high percentage (up to 95%) of small (<20 μm) platelets and preferably have an aspect ratio greater than 5. The platelets can be used as reinforcements for ceramic and metal matrix materials.

9 Claims, 5 Drawing Sheets

PLATELETS FOR PRODUCING SILICON CARBIDE PLATELETS AND THE PLATELETS SO-PRODUCED

This is a continuation of application Ser. No. 07/591,431, filed Oct. 1, 1990, now abandoned.

BACKGROUND OF THE INVENTION

I. Field of the Invention

This invention relates to a process for preparing silicon carbide platelets, to the platelets thus formed and to the use of the platelets for particular applications.

Silicon carbide "platelets" are single crystals of SiC having two dimensions appreciably greater than the third. Generally, platelets have an aspect ratio (i.e. length or width to thickness) greater than 3 and preferably greater than 5.

II. Description of the Prior Art

Silicon carbide in the form of whiskers, i.e. single crystals grown primarily in one dimension, can be used as reinforcing materials for matrices made of various materials, particularly ceramics and metals. However, silicon carbide whiskers are suspected of being a health hazard because, like asbestos fibres, they easily become airborne and can be ingested by humans or animals. There is therefore a need for an alternative to silicon carbide whiskers that offers similar reinforcing effects without the associated risks.

Silicon carbide platelets have come under consideration as alternatives to whiskers for matrix reinforcement, but the platelets produced by the conventional method of reacting silica and carbon at high temperature are generally highly agglomerated and cannot easily be separated. Agglomerated platelets are not very useful as reinforcing materials because they remain in clumps in the matrix and are difficult to disperse. Moreover, the resulting platelets tend to be thicker than desired for an optimum reinforcing effect.

For silicon carbide platelets to be useful in applications such as the reinforcement of ceramic or metal matrix composites, it is believed that they must possess specific attributes, namely:

(a) they must be substantially completely unagglomerated;
(b) the size should preferably be less than 50 $\mu$m, and more preferably less than 30 $\mu$m;
(c) the aspect ratio (width/thickness) should desirably be greater than 5, at a diameter of 10-20 $\mu$m.

In commonly-assigned U.S. Pat. No. 5,080,879 (the disclosure of which is incorporated herein by reference), a process is described for producing single platelets of SiC suitable for matrix reinforcement. The resulting particles have an average size of less than 50 $\mu$m and an aspect ratio greater than 5. While these particles have proven to be most useful for the intended purpose, most of the platelets (about 97%) have a size greater than 20 $\mu$m and I have now found that an even more effective reinforcing effect can be obtained if the majority of the platelets have a size of less than 20 $\mu$m. There is therefore a need for an improved process for producing smaller unagglomerated silicon carbide crystals in high yield.

OBJECTS OF THE INVENTION

Accordingly, an object of the present invention is to provide a process for producing, in good yield, substantially unagglomerated silicon carbide platelets having a large proportion of crystals in the size range of less than 20 $\mu$m, suitable for reinforcing matrix materials, as well as for other purposes.

SUMMARY OF THE INVENTION

According to one aspect of the invention, there is provided a process for producing silicon carbide platelets having a size less than about 20 $\mu$m, which comprises: reacting particles of a non-graphitizable form of hard carbon containing 0.5-1.5% by weight of aluminum and at least 0.2% by weight of iron, said particles having a size of less than 50 $\mu$m, with silica or a silica precursor at a temperature between 1800° and 2100° C. under an inert atmosphere in the presence, if the Fe content of the carbon is between 0.2 to 1.0% by weight, of 0.1-10% by weight of $B_2O_3$ based on the weight of the silica, and in the presence of 0.1-10% by weight, based on the total weight of the reaction mixture, of alpha silicon carbide particles having a size of about 5 $\mu$m or less, the ratio of the weight of silica to carbon, exclusive of impurities, being greater than 1.67.

The invention also relates to the SiC platelets produced by the process.

The process of the invention results in the production of platelets having a high proportion (usually 80-95% of the product yield) of SiC particles of size less than 20 microns, whereas without the addition of the SiC particles, the yield of <20 $\mu$m particles is less than about 3% by wt.

It should be noted that the amounts of any impurities mentioned in the present invention are calculated as the elements themselves but they may be present in the form of compounds such as oxides and carbides.

DETAILED DESCRIPTION OF THE INVENTION

Figure 1:
FIGS. 1-8 are photomicrographs at various high magnifications of SiC products produced according to Examples 2 and 3 below.
Figure 2:
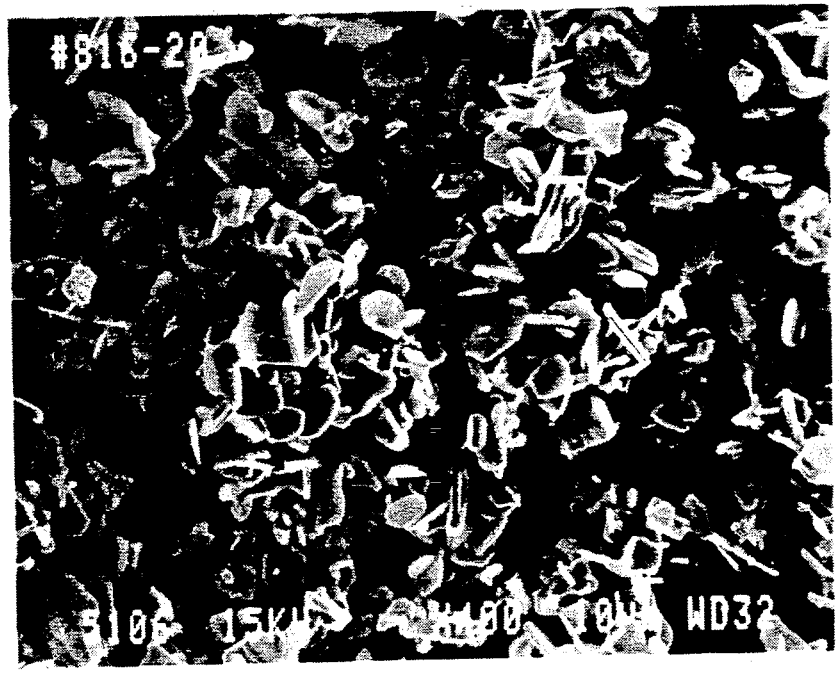
Figure 3:
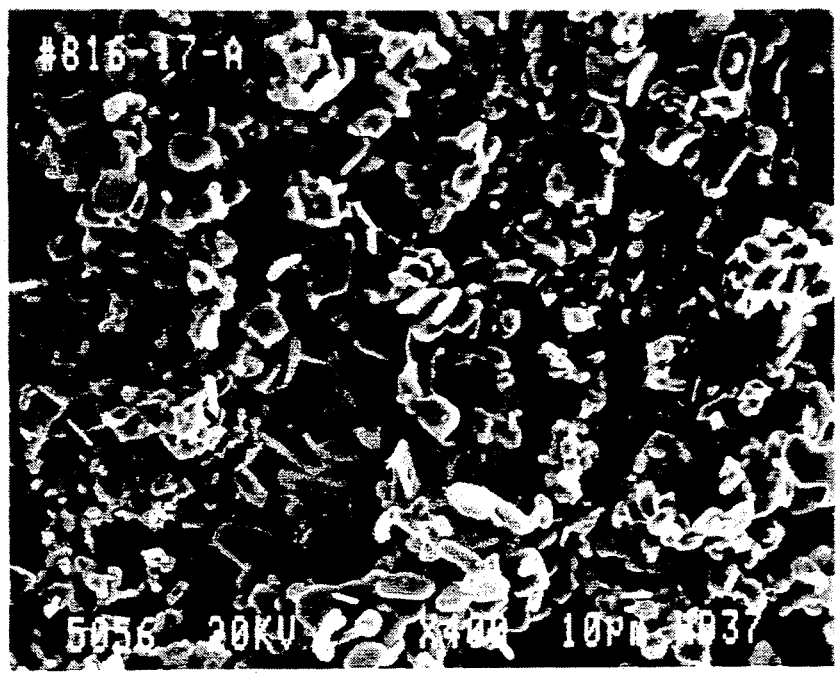
Figure 4:
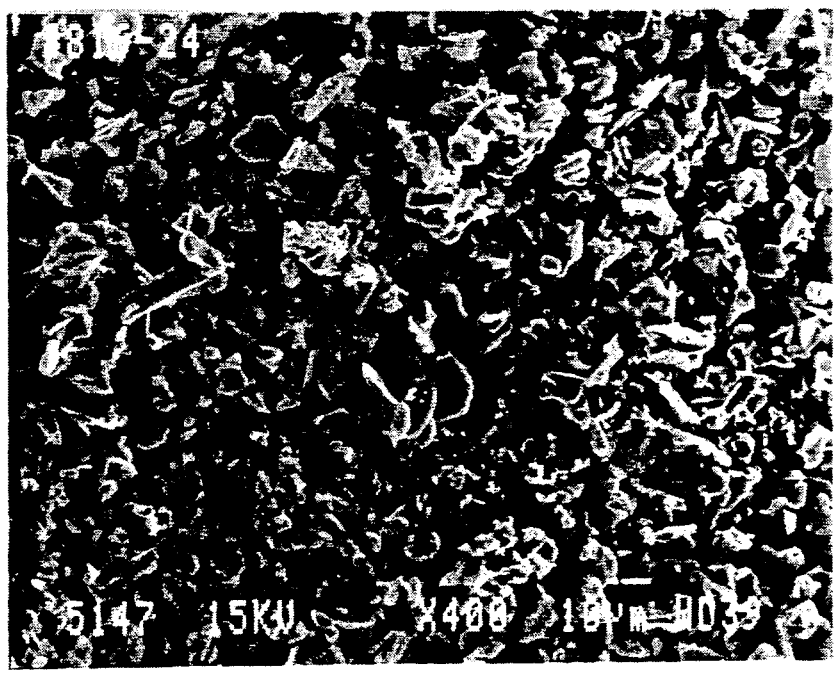
Figure 5:
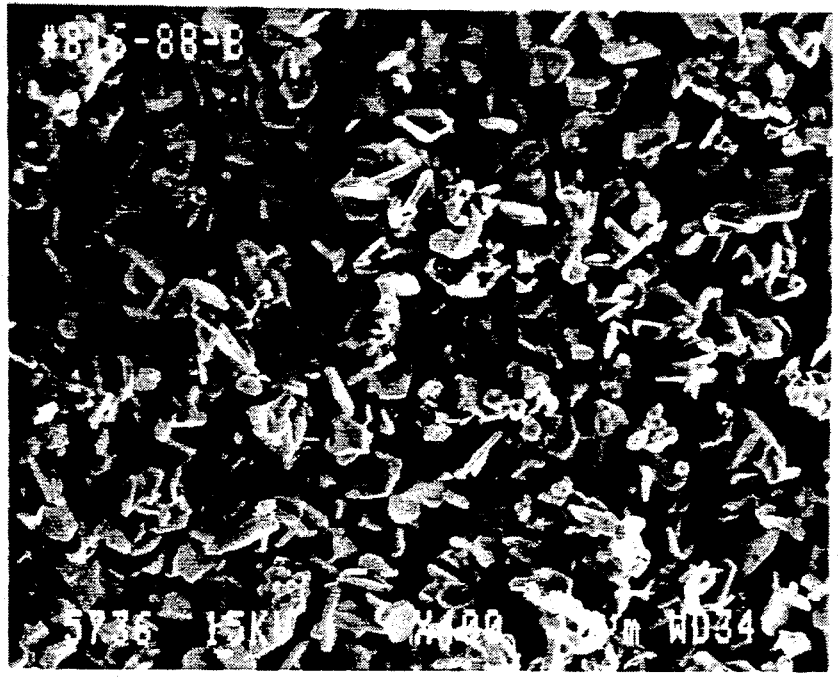

The present invention is based, at least in part, on the unexpected finding that the presence of particles of alpha silicon carbide of 5 $\mu$m or less in size during the reaction of the commonly-assigned prior patent application mentioned above, unexpectedly results in a very substantial increase in the proportion of very small (less than 20 $\mu$m) particles in the product. Thus, the present invention represents a substantial improvement of the invention of the commonly-assigned application because of the higher yield of small particles which have a greatly improved reinforcing effect when used for metal or ceramic matrix reinforcement.

The alpha silicon carbide particles employed in the present invention must be used in an amount of 0.1 to 10% by weight of the total weight of the reaction mixture. If an amount of less than 0.1% by weight is employed, an improvement in the yield of SiC platelets having a size of less than 20 $\mu$m is not obtained. If the amount is more than 10% by weight, the product tends to be in agglomerated form which is undesirable. The preferred amount of alpha SiC is between 0.25 and 1.0% by weight of the reaction mixture.

The added alpha silicon carbide particles should have a particle size of less than 5 $\mu$m. Ideally, the size range is submicronic up to 5 μm. The particles can be obtained by crushing larger alpha SiC platelets or particles made by the process of the present invention, the process of the commonly-assigned application, or any other process, and then classifying the crushed particles to separate the particles in the desired size range.

While the mechanism by which the particles of alpha SiC affect the size range of the product platelets is not precisely known, their presence during the reaction controls the growth of the product particles so that the majority are less than 20 μm in size, and a substantial portion are less than 5 μm in size. The added SiC particles do not appear in the product and thus presumably become part of the product platelets.

Apart from the addition of the alpha SiC particles, the process of the present invention is essentially the same as the process of the commonly-assigned application mentioned above. The details of the process are outlined in the following.

The SiC platelets are produced by reacting carbon and a source of silica in the presence of certain additional materials in a single step reaction. The process employs an impure carbon source which contains iron and aluminum because these elements affect the formation of the platelets and because the elements are dispersed thoroughly within the carbon precursor material, being natural ingredients of that material. Moreover, the process of the present invention is carried out at a lower temperature than is often employed for the formation of SiC because this is found to give a more desirable product. The lower reaction temperature is feasible due to the presence of the specific impurities (Fe and Al) in the carbon source. This lower reaction temperature is essential to obtain the desired smaller platelets.

The specific carbon source used in the present invention is a non-graphitizable hard carbon which contains at least 0.2% by weight of Fe and between 0.5 and 1.5% Al and which has been electrically calcined in a non-reactive atmosphere. Anthracite coal is a particularly preferred naturally occurring non-graphitizable hard carbon which contains the required impurities. Anthracite generally contains less than about 10% by weight of volatile materials (normally 7-10%) and less than about 10% by weight of ash remaining after combustion (normally 4-10%). Anthracite is available from various mines around the world, but Pennsylvania anthracite is particularly preferred in the present invention because of its superior results. This anthracite is extremely dense (real density over 1.80) with porosity of less than 10%. A typical electrically calcined (1800°-2200° C.) Pennsylvania anthracite composition in percent by weight is shown in Table 1 below:

TABLE 1

| % Si | 1.3-2.0 |
|---|---|
| % Al | 1.1-1.3 |
| % Fe | 0.3-0.6 |
| % S | 0.3 |
| % Ca | 0.05-0.20 |
| % Ash | 6-10 |
| % Carbon | Balance |

The anthracite, or other similar hard carbon, must be calcined before use at a temperature above about 1500° C. (preferably 1600°-2200° C. and optionally about 1800° C.). The only practical way of doing this is by electrical calcination during which an electrical current is passed directly through the coal. The calcination is carried out under a non-oxidizing atmosphere (e.g. an atmosphere of Ar, a vacuum, or the atmosphere generated by the reactants themselves) for a time suitable for the removal of substantially all of the volatiles (usually a few hours). The calcined product should be allowed to cool in the same non-oxidizing atmosphere. The calcined product usually contains 90-96% by weight of carbon, with the remainder being ash. The calcination step also converts the impurities from oxides to carbides. This precalcination step is an important feature of the present invention, although the reason why it is necessary is not completely clear.

It is to be noted that the impurities are extremely well distributed in calcined anthracite and play a critical role in the synthesis of the platelets. It is found that similar results cannot be duplicated if similar impurities are added to other carbon sources, such as petroleum coke, carbon black, etc. This indicates that there are some other factors pertaining to the carbon source of the present invention which are critical to the process, although these factores are not clear at this time.

The level of impurities, especially that of Fe, is very critical. At Fe contents between 0.2-1.0% by weight, the addition of boron, preferably in the form of $B_2O_3$, to the extent of 0.1-10% by weight of the $SiO_2$, is found to be essential and should be added if not already present. At Fe contents above about 1%, the addition of boron or other additives is not required to produce suitable platelets. When boron is required, boron oxide or a precursor thereof can simply be added to the mixture of the starting materials or to the anthracite in the "green" state before it is calcined.

The particle size of the carbon source, e.g. anthracite after calcination, is also important. Platelets are not generally produced when the particles have a size above about 50 μm. Particles of calcined anthracite in the size range of 5-50 μm are preferred and can be obtained by grinding the anthracite after the calcination step, e.g. to −200 Tyler mesh, and preferably to −325 Tyler mesh (equivalent to 45 μm), using suitable equipment, e.g. a ball-mill.

Although it is essential to use the carbon source described above in the present invention, it has been found that this carbon source need not contribute the entire carbon required for the reaction. Up to 50% by weight of the carbon required for the reaction may come from another carbon source such as petroleum coke. However, carbon black and polymeric forms of carbon are unsatisfactory. The use of between 50 and 100% by weight of calcined anthracite and the remainder petroleum coke results in the need for a higher reaction temperature (above 2050° C.) and yields product platelets having a lower aspect ratio of between 3 and 4. A useful product is nevertheless produced.

Another important feature of the process requires the presence of excess oxygen in the reactants during the reaction step. This is ensured by using excess $SiO_2$ over that required stoichiometrically to produce SiC by the reaction with carbon. This requires a weight ratio of $SiO_2$ to C exceeding 1.67. These ratios refer to pure $SiO_2$ and C, exclusive of any impurities; i.e. for C, this is not the weight of the anthracite, but rather the weight of the C in the anthracite. During the reaction, the excess $SiO_2$ is converted into SiO which then reacts with the impurities to form a liquid phase at temperatures near 2000° C., which helps to promote synthesis of the platelets. Without the excess $SiO_2$, no platelets are produced. The presence of oxygen is so critical that if the reaction is conducted under an atmosphere of pure nitrogen, no platelets are produced. It is found that the $N_2$ replaces the oxygen in the product and thus prevents the formation of the liquid phase. The reaction therefore has to be conducted under an inert atmosphere, such as that formed by a noble gas, e.g. argon. However, nitrogen concentrations up to about 25% by volume can be tolerated without undesirable effects.

Although the silica should be present in stoichiometrical excess, which is the case when the weight ratio is greater than 1.67 as stated, the excess of silica should preferably not be greater than 10% by weight because the excess SiO then tends to block the furnace. The maximum weight ratio of silica to carbon in the starting materials is generally 1.9.

Any suitable source of silica can be employed but amorphous silica, e.g. fume silica obtained from the ferro-silicon industries, is preferred. Alternatively, a silica precursor, i.e. a material that is converted to silica under the reaction conditions, can be employed. Examples of silica precursors are organosilicon compounds such as triethoxy-silane. The particle size of the silica or silica precursor is preferably less than 1 μm.

Suitable fume silica products can be obtained from SKW (Beacancour, Canada) and Elkem Industries (Norway). Fume silica contains impurities which may help to catalyse the platelet formation, although the impurities (except perhaps for potassium compounds) tend to be the same as those in calcined anthracite. The compositions of two fume silica products useful in the presest invention are shown in Table 2 below, in which percentages are by weight:

TABLE 2

|  | PRODUCT FORM SKW | PRODUCT FORM ELKEM |
| --- | --- | --- |
| % C | 1-2 | 1-2 |
| % $Fe_2O_3$ | 0.15-0.40 | 0.05-0.10 |
| % $Al_2O_3$ | 0.60-1.00 | <0.1 |
| % CaO | 0.40 | 0.3 |
| % $K_2O$ | 0.70-1.00 | 0.5 |
| % $SiO_2$ | balance | balance |

The reaction of the present invention normally takes about one to two hours to complete and, after completion, the inert atmosphere should be maintained until the product has cooled down sufficiently.

If desired, the silicon carbide products of the present invention can be purified by the following procedure so that they can be used more effectively for such purposes as reinforcements for ceramic matrix composites, for which purpose in particular impurities are generally unacceptable because they form glassy phases in the final products.

The impurities in the silicon carbide product produced by the present invention, such as Fe, Al, Ca, B, etc., are normally present to a large extent on the external surfaces of the platelets, often at the boundary between two adjacent particles, and are usually in the form of silicides. Although the impurities, being on the surface, are accessible to acid leaching, they cannot be removed by HCl (which is normally used for such purposes). It is believed that this is because the impurities are protected by a protective layer of $SiO_2$ during the formation process mentioned above. This problem can, however, be overcome by using a combination of HF and HCl or gaseous chlorine, because the HF dissolves the $SiO_2$ and the impurities become accessible to the HCl or $Cl_2$. For example, the purification procedure can be carried out by first leaching the product in hydrofluoric acid at a temperature of about 70° C. to remove the protective coating of $SiO_2$, and then treating the resulting product with either hydrochloric acid or with gaseous chlorine to remove the exposed impurities. When iron is the impurity, the reaction involved is given below:

$$FeSi + 3HCl + 6HF \rightarrow FeCl_3 + H_2SiF_6 + 3.5H_2 \uparrow$$

As noted above, the platelets produced by the present invention can be used in particular for the reinforcement of ceramic matrix composites. Any suitable matrix material may be reinforced in this way, examples being alumina, mullite, silicon nitride, etc. Reinforcement of these materials using the platelets of the present invention can produce products having mechanical properties similar to those obtained with SiC whiskers due to the high aspect ratios and small size (less than 20 μm) of the platelets, while avoiding the health risks attendant on the use of whiskers.

The platelets produced by the present invention can be used as such for matrix reinforcement or the small percentage of platelets larger than 20 μm may first be removed by screening, air classification, etc. to avoid their adverse effect on the mechanical properties of the material.

The invention is illustrated further by the following non-limiting Examples and Comparative Examples.

EXAMPLE 1

Silica, electrically calcined Pennsylvania anthracite, boron oxide and α-SiC (3.9 μm mean diameter; 95% less than 7 μm) in the weight proportion 3:1.75:0.1:0.05, respectively, were mixed together and heated at 1950° C. for two hours in an inert atmosphere.

After cooling, SiC platelets were obtained, 80% of which had a size less than 20 μm.

EXAMPLE 2

This Example is to demonstrate that the amount of alpha SiC particles must be greater than the minimum amount of 0.1% by weight in order to control the growth of the product.

Five runs were carried out under the conditions summarized in Table 3. The inert atmosphere during the heating was provided by argon. The added alpha SiC particles had an average size of 4 microns, and varied between 1 and 10 microns in size.

The results of these runs are summarized in Table 3 and photomicrographs of the resulting platelets are shown in FIGS. 1, 2, 3, 4 and 5.

TABLE 3

| | Reaction Mixture Parts by Weight | | | | Reaction Conditions | | Product | |
| --- | --- | --- | --- | --- | --- | --- | --- | --- |
| Run | $SiO_2$ | Electrically calcined Pennsylvania Anthracite | $B_2O_3$ | SiC Particles | Temp. (°C.) | Time (h) | Size of Platelets (microns) | Figure |
| 1 | 3 | 1.75 | 0.1 | 0.025 | 2050 | 2 | <20 | 1 |

TABLE 3-continued

| | | Reaction Mixture Parts by Weight | | | Reaction Conditions | | Product | |
| --- | --- | --- | --- | --- | --- | --- | --- | --- |
| Run | SiO$_2$ | Electrically calcined Pennsylvania Anthracite | B$_2$O$_3$ | SiC Particles | Temp. (°C.) | Time (h) | Size of Platelets (microns) | Figure |
| 2 | 3 | 1.75 | 0.1 | 0.025 | 1950 | 2 | <20 | 2 |
| 3 | 3 | 1.75 | 0.1 | 0.4 | 1950 | 2 | <20 agglomerated | 3 |
| 4 | 3 | 1.75 | 0.1 | 0.0125 | 1950 | 2 | little platelet product | 4 |
| 5 | 3 | 1.75 | 0.1 | 0.025 | 1850 | 2 | <20 | 5 |

Runs 1 and 2 demonstrate that at both 1950° and 2050° C., the addition of alpha SiC particles is effective in limiting the growth of the product platelets to less than 20 microns in size.

Runs 2, 3 and 4 demonstrate that at 1950° C., the addition of 0.4 parts of alpha SiC causes agglomeration of the platelets, while the addition of only 0.0125 parts of alpha SiC is insufficient to give product. It is concluded that, for SiC particles of this size, the amount of alpha SiC required is between 0.4 and 0.0125 parts or, on a % basis on the total weight of the reaction mixture, between 0.25 and 7.6%. The amount of SiC required is dependent to some extent on the size of the SiC particles. A larger amount of larger crystals is normally required to achieve the same effect, and the upper limit is about 10 wt % for larger particles.

Run 5 demonstrates that at 1850° C., satisfactory platelets are produced, when 0.025 parts of alpha SiC particles have been added to the reaction mixture.

EXAMPLE 3

This Example is to demonstrate that the alpha SiC particles must be less than 5 microns in size in order to be effective for seeding.

Figure 6:
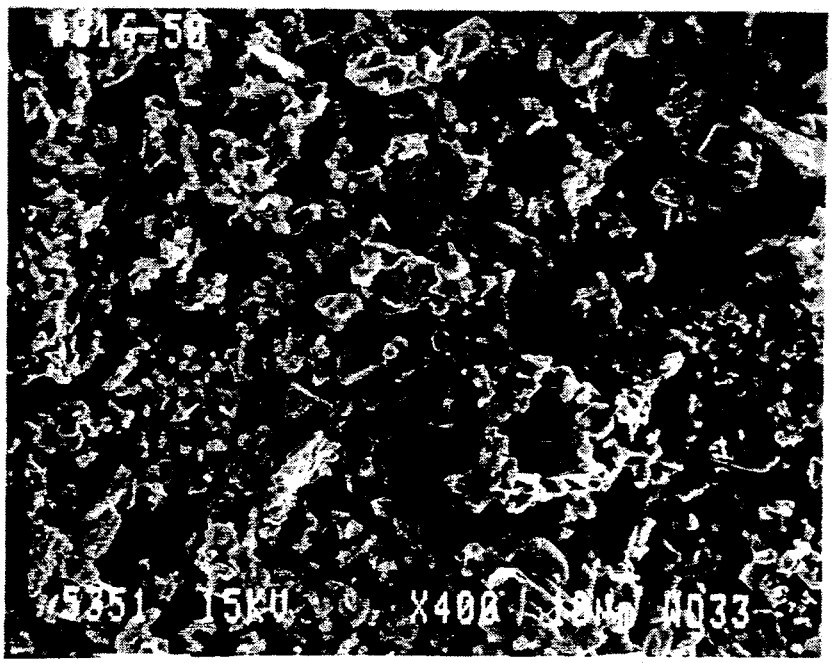
Figure 7:
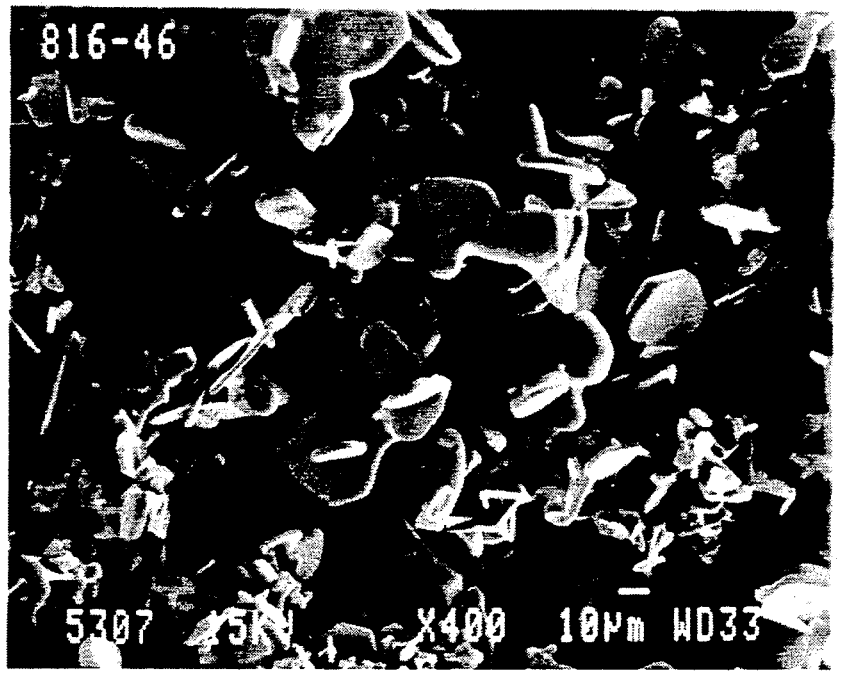
Figure 8:
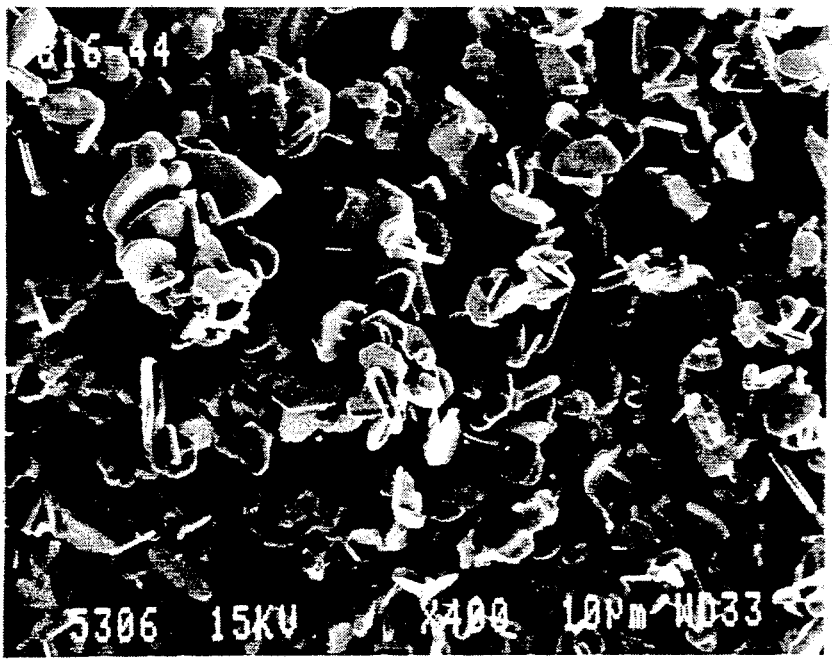

The experimental conditions (and starting materials other than SiC) were the same as those used in the previous Example, with 0.025 parts of alpha SiC particles being added to the reaction mixture, and the heating being carried out at 1950° C. for 2 hours. The added alpha SiC particles were of three nominal sizes: 10, 5 and 2.5 microns. The results are summarized in TABLE 4, and the resulting platelets are shown in FIGS. 6, 7 and 8.

TABLE 4

| | Dimensions of α Sic Particles | | | |
| --- | --- | --- | --- | --- |
| Run | Mean Diameter (microns) | 95% of Particles Between (microns) | Figure | Product Description |
| 6 | 10 | 6–15 | 6 | Incomplete transformation into platelets |
| 7 | 5 | 3–8 | 7 | Complete transformation larger platelets |
| 8 | 2.5 | 1–4 submicron particles present | 8 | Complete transformation into small platelets |

The results show that alpha SiC particles of 10 microns in size (Run 6), are not effective in controlling the growth of the product; particles 5 microns in size (Run 7) are only partially effective; but particles 2.5 microns in size (Run 8) were the most effective in limiting the size of the product platelets. Accordingly it is concluded that the alpha SiC particles should be 5 microns or less in size to obtain the optimum results.

EXAMPLE 4

Figure 9:
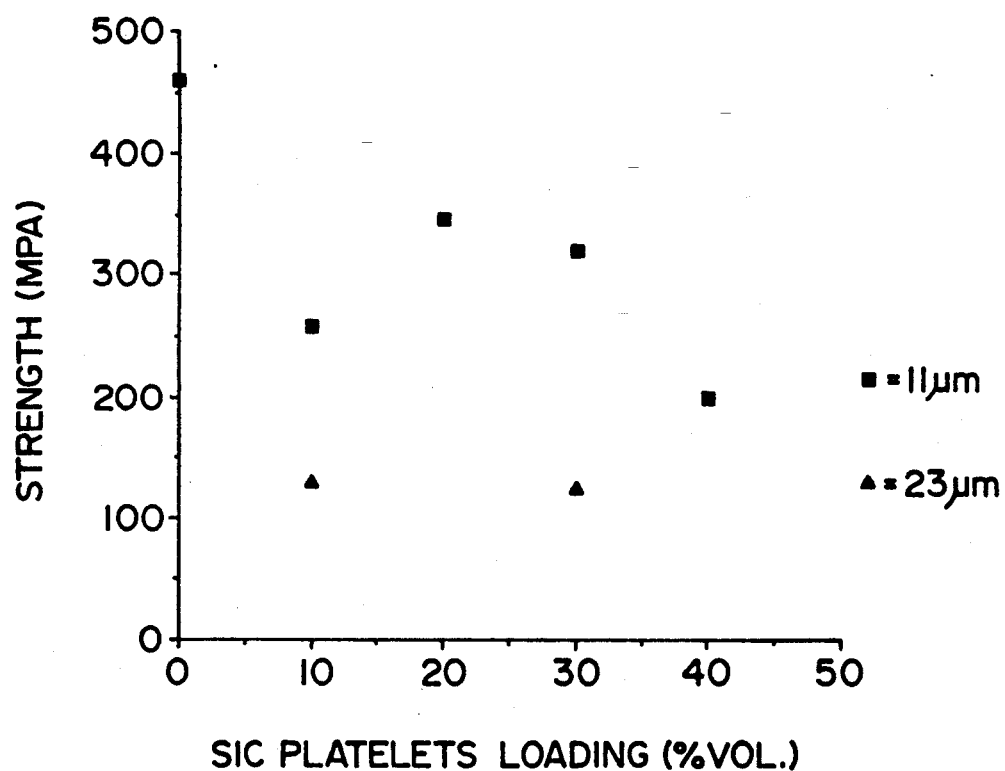
FIG. 9 is a graph showing the strength of alumina/SiC composites containing platelets both smaller and larger than 20 $\mu$m.

Various alumina-silicon carbide composites were produced using SiC platelets of 11 μm and 23 μm in size (mean diameter) and varying amounts of the platelets. The strength of the composites was then tested and the results are shown in FIG. 9.

It is clear from the figure that the compositions containing the 11 μm particles exhibited higher strength.

What I claim is:

1. A process for producing unagglomerated silicon carbide platelets, 80–95% of which have a size smaller than 20 μm and aspect ratios of 5 to 8, which comprises: reacting particles of a non-graphitizable form of hard carbon containing 0.5–1.5% by weight of aluminum and at least 0.2% by weight of iron, said particles having a size of 5–50 μm, with silica or a silica precursor in the form of particles having a size of less than about 1 μm at a temperature between 1800° and 2100° C. under a noble gas atmosphere in the presence, when the Fe content of the carbon is between 0.2 to 1.0% by weight, of 0.1–10% by weight of B$_2$O$_3$ based on the weight of silica, and in the presence of 0.25–10% by weight, based on the total weight of the reaction mixture, of alpha silicon carbide particles having a size of about 5 μm or less, the ratio of the weight of silica to carbon, exclusive of impurities, being 1.67–2.3.

2. A process according to claim 1 wherein said non-graphitizable form of hard carbon is electrically calcined anthracite coal.

3. A process according to claim 4 wherein the anthracite coal is Pennsylvania anthracite.

4. A process according to claim 1, wherein said inert atmosphere comprises argon.

5. A process according to claim 1, wherein said inert atmosphere contains up to about 25% by volume of nitrogen.

6. A process according to claim 1, wherein said silica is fume silica from the ferrosilicon industry.

7. A process according to claim 1, wherein said silicon carbide platelets are purified, after formation, by treating them with hydrofluoric acid and a reagent selected from the group consisting of HCl and gaseous chlorine.

8. A process according to claim 1, wherein said non-graphitizable hard carbon forms at least 50% by weight of the carbon with which said silica or silica precursor reacts to form said platelets.

9. A process according to claim 8 wherein the remainder of said carbon with which said silica or silica precursor reacts is derived from petroleum coke.

* * * * *